United States Patent [19]
Makinouchi

[11] Patent Number: 5,714,860
[45] Date of Patent: Feb. 3, 1998

[54] STAGE DEVICE CAPABLE OF APPLYING A DAMPING FORCE TO A MOVABLE MEMBER

[75] Inventor: Susumu Makinouchi, Zama, Japan

[73] Assignee: Nikon Corporation, Tokyo, Japan

[21] Appl. No.: 555,177

[22] Filed: Nov. 8, 1995

[30] Foreign Application Priority Data

Mar. 7, 1995 [JP] Japan .................... 7-047175

[51] Int. Cl.$^6$ .................................................. G05B 13/00
[52] U.S. Cl. .................................. 318/561; 318/611
[58] Field of Search .................... 318/560, 566, 318/568.17, 611, 687, 38, 40, 48

[56] References Cited

U.S. PATENT DOCUMENTS

| | | | |
|---|---|---|---|
| 3,434,025 | 3/1969 | Parkinson et al. | 318/8 |
| 3,940,676 | 2/1976 | Dudley | 318/612 |
| 4,007,412 | 2/1977 | Vold | 318/676 |
| 4,591,772 | 5/1986 | Hollow | 318/632 |
| 4,890,023 | 12/1989 | Hinds et al. | 310/12 |
| 5,223,778 | 6/1993 | Svarovsky et al. | 318/610 |
| 5,389,862 | 2/1995 | Tominaga | 318/254 |
| 5,419,492 | 5/1995 | Gant et al. | 239/88 |
| 5,446,519 | 8/1995 | Makinouchi | 355/53 |
| 5,572,558 | 11/1996 | Beherns | 375/376 |
| 5,633,720 | 5/1997 | Takahashi | 356/401 |

*Primary Examiner*—Brian Sircus
*Attorney, Agent, or Firm*—Shapiro and Shapiro

[57] ABSTRACT

A stage device comprises a base, a movable member movably provided on the base, a damping system for giving a damping force to the movable member, a position detector for detecting a position of the movable member with respect to the base, a deviation detector for obtaining a deviation of a position of the movable member from a target position of the movable member on the base on the basis of a result of the detection by the position detector and a damping control system for changing the damping force in accordance with the deviation detected by the deviation detector.

12 Claims, 3 Drawing Sheets

STAGE DEVICE CAPABLE OF APPLYING A DAMPING FORCE TO A MOVABLE MEMBER

BACKGROUND OF THE INVENTION

1. Field of the Invention

The present invention relates generally to a stage device equipped with a damping mechanism separately from a drive mechanism and, more particularly, to a stage device suitable for, e.g., an exposure apparatus for manufacturing a semiconductor device, etc. or suitable to use for high-accuracy locating by a precise machine tool, etc.

2. Related Background Art

In recent years, a high-accuracy and high-speed locating operation has been increasingly required in a stage device employed for locating at a high accuracy in an exposure apparatus used for manufacturing a semiconductor device or a liquid crystal display device, a precise measuring machine entailing the use of laser beams or a precision machine tool, etc. This type of stage device has an independent vibration system constructed of a support mechanism for a workpiece (wafer, etc.) that generally includes a table and a table driving mechanism. This stage device needs a long time complete a locating operation is completed due to vibrations such as so-called hunting caused when stopping the table (when decelerating). Besides, locating accuracy declines, and it is therefore required that a dynamic characteristic of the vibration system be improved.

Under such circumstances, as disclosed in, e.g., U.S. application Ser. No. 663,367 filed on Mar. 1, 1991, there is proposed a stage device constructed such that a damping mechanism such as a linear motor, etc. is provided along a moving direction of a table separately from a table driving mechanism, and the vibrations caused by the driving mechanism are restrained by operating the damping mechanism when stopping or decelerating the table. This type of damping mechanism, after an absolute value of a positional deviation of an actual (measured) position of the table from a target position thereof has fallen within a predetermined allowable range, gives the table a resisting force (damping force) obtained by multiplying an absolute value of a moving velocity by a predetermined damping coefficient in a direction opposite to the moving direction of the table.

According to the prior art described above, reducing a quantity of vibrations of the table requires an increase in the damping coefficient (increase in the damping force) of the damping mechanism. If the damping coefficient is simply increased, however, the resisting force against the table augments, with the result that the time elongates till the locating operation is done. This leads to such a disadvantage that driving electric power of the table driving mechanism rises.

SUMMARY OF THE INVENTION

It is a primary object of the present invention, which was devised in view of the above points, to provide a stage device capable of reducing both a quantity of vibrations of a movable member such as a table, etc. and a time for locating and preventing an increase in load on a driving mechanism for the movable member.

To accomplish the above object, according to one aspect of the present invention, a stage device, for example, as illustrated in FIG. 2, comprises a base 5X, a movable member 1 movably provided on this base 5X, a driving system 6X, 7X for moving this movable member 1 with respect to the base 5X, a position detector 8X, 9X for detecting a position of the movable member 1 with respect to the base 5X, a deviation detector 23 for obtaining a deviation $\Delta X_i$ of a position of the movable member 1 from a target position of the movable member 1 on the base 5X on the basis of a result of the detection by this position detector 8X, 9X, a damping system 3X, 4X for hindering a relative movement of the movable member 1 with respect to the base 5X and a damping control system 26 for controlling the damping force of the damping system 3X, 4X in accordance with the deviation detected by the deviation detector 23.

In this case, a linear motor is one example of the damping system.

Further, the damping control system desirably reduces the damping force as an absolute value of the deviation detected by the deviation detector 23 increases.

According to the thus constructed present invention, for example, the damping coefficient conceived as a ratio of the damping force of the damping system 3X, 4X with respect to the moving velocity of the movable member 1 is switched consecutively or stepwise corresponding to a degree of the deviation of the actual position from the target position of the movable member 1. Accordingly, the damping force is not generated (damping coefficient is 0) in a range where the absolute value of the deviation is larger than a certain degree, but an intermediate damping force is produced when the deviation comes to the certain degree or under. Further, a large damping force is generated in the vicinity of the target position where the deviation becomes relatively small. The time till the locating operation is done is thereby reduced without increasing the load on the driving system 6X, 7X, and, as a result, a quantity of vibrations of the movable member 1 is decreased.

Further, if the damping system thereof is the linear motor, the vibrations of the movable member 1 can be attenuated in a non-contact manner at a high speed.

Moreover, if the damping coefficient control system decreases the damping force as the absolute value of the deviation detected by the deviation detector 23 increases, the position of the movable member 1 smoothly converges at the target position.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENT

One embodiment of a stage device according to the present invention will be described with reference to the accompanying drawings.

In this embodiment, the present invention is applied to a wafer stage of a projection exposure apparatus such as a stepper, etc. for exposing a reduced image of a reticle pattern onto each shot area of a wafer through a projection optical system.

Figure 1:
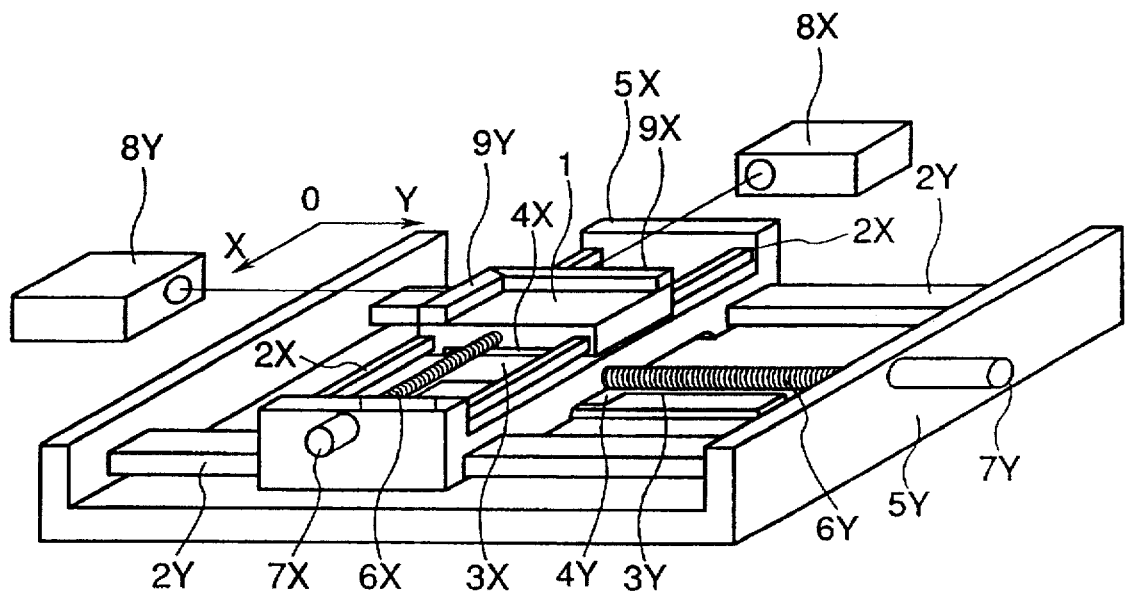
FIG. 1 is a perspective view showing one embodiment of a stage device according to the present invention.

FIG. 1 illustrates a wafer stage in accordance with this embodiment. Referring to FIG. 1, a wafer coated with a photoresist as an object for exposure is placed on a sample stage 1 conceived as a movable member. The sample stage 1 is so supported as to be movable within the horizontal plane, wherein X- and Y-axes are set in a rectangular coordinate system within the horizontal plane. In this case, the sample stage 1 is so supported as to be movable in an X-direction with the aid of a guide mechanism (air bearings and so forth) 2X on an X-stage base 5X. Then, a rotary motor 7X fixed to the X-stage base 5X is connected to the sample stage 1 through a feed screw 6X extending in the X-direction, and the rotary motor 7X rotates the feed screw 6X, whereby the sample stage 1 is moved back and forth in the X-direction. In accordance with this embodiment, a movable member 4X is fixed onto the bottom surface of the sample stage 1, while a fixed member 3X is fixed onto the X-stage base 5X in a face-to-face relationship with the movable member 4X. The fixed member 3X and the movable member 4X are combined to constitute a linear motor (hereinafter referred to as a "first linear motor") serving as an X-axial damping device.

Further, the X-stage base 5X is so supported as to be movable in the Y-direction with the aid of a guide mechanism (air bearings, etc.) 2Y on a Y-stage base 5Y. Also, the X-stage base 5X is connected to a rotary motor 7Y fixed to the Y-stage base 5Y via a feed screw 6Y extending in the Y-direction. The rotary motor 7Y rotates the feed screw 6Y, whereby the X-stage base 5X is moved to and fro in the Y-direction. Then, a movable member 4Y fixed onto the bottom surface of the X-stage base 5X and a fixed member 3Y fixed onto the Y-stage base 5Y are combined to constitute a linear motor (hereinafter called a "second linear motor") serving as a Y-axial damping device.

Further, a movable mirror 9X has a reflective surface substantially perpendicular to the X-axis. A movable mirror 9Y has a reflective surface substantially perpendicular to the Y-axis. The movable mirrors 9X, 9Y are fixed onto the upper surface of the sample stage 1. An X-axial laser interferometer 8X and a Y-axial laser interferometer 8Y are individually fixed onto a fixed panel (unillustrated) mounted with the Y-stage base 5Y in the face-to-face relationship with the movable mirrors 9X, 9Y. In this case, the movable mirror 9X and the laser interferometer 8X cooperate to detect an X-directional position (X-coordinates) of the sample stage 1 with a resolution on the order of, e.g., 0.01 μm at all times. The movable mirror 9Y and the laser interferometer 8Y cooperate to detect Y-coordinates of the sample stage 1 with a resolution on the order of, e.g., 0.01 μm at all times. An unillustrated stage control system drives the rotary motors 7X, 7Y to operate on the basis of these measured values, thereby locating the sample stage 1 in the X and Y directions. Further, in accordance with this embodiment, restraining vibrations when locating the sample stage 1 involves the use of the first linear motor (3X, 4X) and the second linear motor (3Y, 4Y) as the damping devices. Hereinafter, a construction and an operation of the damping device in this embodiment will be explained by exemplifying an X-directional operation thereof.

Figure 2:
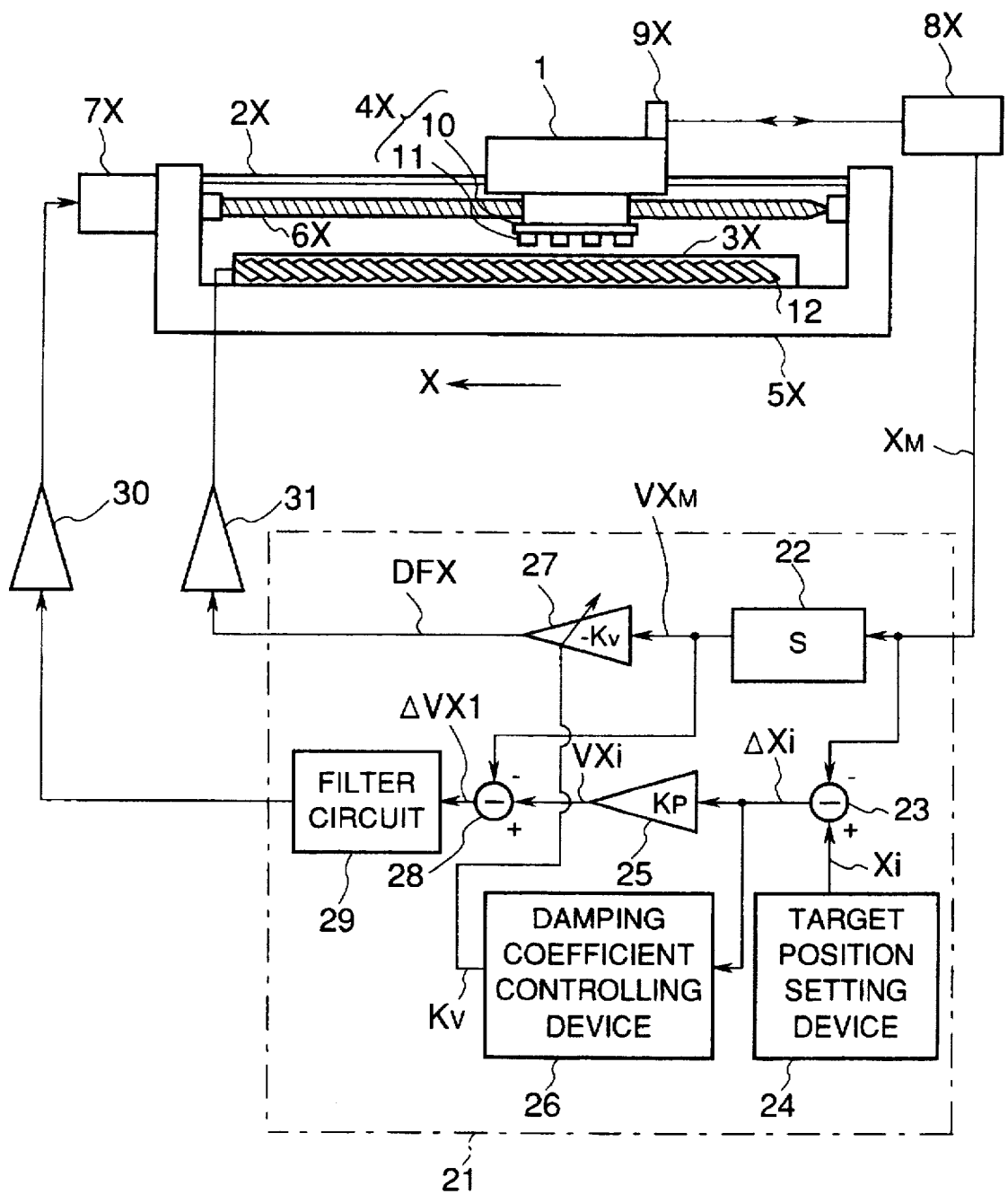
FIG. 2 is a view illustrating a stage mechanism for driving a sample stage 1 in an X-direction in FIG. 1 and configuration of a control system for this stage mechanism.

FIG. 2 is a side view illustrating a stage mechanism for driving the sample stage 1 in the X-direction in FIG. 1 as well as being a block diagram illustrating a control system thereof. In the stage mechanism of FIG. 2, there is shown a guide member 2X of FIG. 1 with some side portions cut away. Referring to FIG. 2, the fixed member 3X of the first linear motor is constructed by mounting coil 12 into a predetermined cover. The movable member 4X is constructed by fixing a plurality of magnets 11 at a predetermined pitch in the X-direction onto the bottom surface of a tabular back yoke 10 fixed onto the bottom surface of the sample stage 1 so that polarities thereof are sequentially inverted. Namely, the first linear motor in this embodiment is of a moving magnet type and has a low probability of fault occurrence because of a simplified construction of the movable member 4X as well as being easy to maintain. There may be also, however, used a linear motor of a moving coil type in which the coil is provided on the side of the movable member.

Next, a computer-based stage control system 21 in this embodiment will be described. An X-coordinate $X_M$ of the sample stage 1 that is measured by the external X-axial laser interferometer 8X is supplied to an input of a differentiator 22 and to a subtraction-side input of a subtracter 23. The differentiator 22 differentiates a supplied X-coordinate $X_M$ with respect to time, thereby calculating an X-directional velocity $VX_M$ of the sample stage 1. This velocity $VX_M$ is supplied to an input of a variable gain amplifier 27 and to a subtraction-side input of a subtracter 28. Note that the differentiator 22 in the stage control system 21 is defined as a function executed on the software of the computer, and, therefore, a differential calculation thereof is, as a matter of fact, executed based on, e.g., a difference calculation and a dividing calculation of dividing a resultant value of difference by a sampling period.

A subtraction-side input of the subtracter 23 is supplied with an X-direction locating target coordinate $X_i$ of the sample stage 1 from a target position setting device 24. The subtracter 23 subtracts the present X-coordinate $X_M$ of the sample stage 1 from the target coordinate $X_i$, thereby obtaining a positional deviation $\Delta X_i$ (=$X_i$-$X_M$). This positional deviation $\Delta X_i$ is supplied to an input of a positional gain device 25 and to an input of a damping coefficient controlling device 26. The positional gain device 25 obtains a target drive velocity $VX_i$ by multiplying the positional deviation $\Delta X_i$ by a coefficient $K_P$ for calculating a velocity corresponding to each positional deviation. An addition-side input of the subtracter 28 is supplied with the target drive velocity $VX_i$. The subtracter 28 obtains an X-directional velocity deviation $\Delta VX_i$ by subtracting the measured velocity $VX_M$ of the sample stage 1 from the target drive velocity $VX_i$. This velocity deviation $\Delta VX_i$ is supplied to a filter circuit 29. The filter circuit 29 operates as, e.g., a low-pass filter circuit and generates a drive velocity signal corresponding to a low frequency component of the velocity deviation $\Delta VX_i$ supplied. This drive velocity signal is supplied to a power amplifier 30 provided outwardly of the stage control system 21. The power amplifier 30 supplies the rotary motor 7X with drive electric power obtained by adding drive electric power corresponding to the supplied drive velocity signal to present drive electric power, and the rotary motor 7X rotates the feed screw 6X to move the sample stage 1 in the X-direction at the target drive velocity $VX_i$.

Further, the damping coefficient controlling device 26 obtains a damping coefficient $K_V$ (force/velocity) having a positive value corresponding to an absolute value of the supplied positional deviation $\Delta X_i$. This damping coefficient $K_V$ is supplied to a gain indicating element of the variable gain amplifier 27. The variable gain amplifier 27 multiplies the supplied X-directional velocity $VX_M$ of the sample stage 1 by a value obtained by inverting a sign of the supplied damping coefficient $K_V$, thereby acquiring an X-directional damping force DFX. A drive signal corresponding to this damping force DFX is supplied to the power amplifier 31 disposed externally of the stage control system 21. The power amplifier 31 supplies the fixed member 3X with the driving current so that the movable member 4X of the first linear motor 4X is biased with respect to the fixed member 3X by a thrust equal to the damping force DFX in the X-direction. Made thereby to act simultaneously on the sample stage 1 are a force for driving the sample stage 1 at the target drive velocity $VX_i$ in the X-direction with the rotary motor 7X and the X-directional damping force DFX corresponding to the actual velocity $VX_M$ of the sample stage 1.

In this case, the damping force DFX is expressed by the following formula:

$$DFX = -K_V \cdot VX_M \qquad (1)$$

That is, the damping force DFX is a force acting in the direction opposite to the actual moving X-direction of the sample stage 1, whereby the vibrations of the sample stage 1 are restrained. Further, a damping force coefficient $K_V$ thereof is set at three stages in accordance with a magnitude of the positional deviation $\Delta X_i$ with respect to the target position of the sample stage 1 in this embodiment.

Figure 3A:
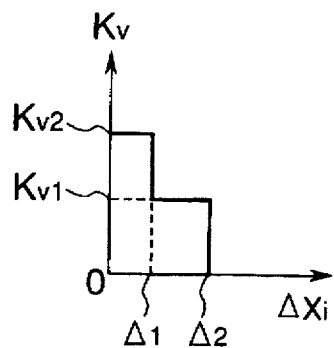
FIG. 3A is a graph showing an example where a damping coefficient is switched stepwise corresponding to a positional deviation.

FIG. 3A shows a relationship of the damping coefficient $K_V$ versus the magnitude (absolute value) of the positional deviation $\Delta X_i$ in this embodiment. Referring to FIG. 3A, in an area where $0 \leq \Delta X_i < \Delta_1$, a value of the damping coefficient $K_V$ is $K_{V2}$. In an area where $\Delta_1 \leq \Delta X_i < \Delta_2$, the value of the damping coefficient $K_V$ is $K_{V1}$ ($K_{V1} < K_{V2}$). In an area where $\Delta_2 < \Delta X_i$, the value of the damping coefficient $K_V$ is 0. That is, the value of the damping coefficient $K_V$ decreases stepwise as the positional deviation $\Delta X_i$ increases. In an area where the positional deviation $\Delta X_i$ exceeds $\Delta_2$, the value of the damping coefficient $K_V$ is 0.

Accordingly, supposing that the X-directional velocity $VX_M$ of the sample stage 1 is fixed, it can be known from the formula (1) that the damping force DFX acting on the sample stage 1 from the first linear motor (3X, 4X) in FIG. 2 decreases stepwise with a larger absolute value of the positional deviation $\Delta X_i$ but comes to 0 in the area where the absolute value of the positional deviation $\Delta X_i$ exceeds $\Delta_2$. If the damping force DFX thus changes depending on the absolute value of the positional deviation $\Delta X_i$, and when locating the sample stage 1 at the target coordinate $X_i$ in the X-direction, the positional deviation $\Delta X_i$ thereof extremely smoothly converges at 0 in a short time as shown in FIG. 4C.

Figure 4A:
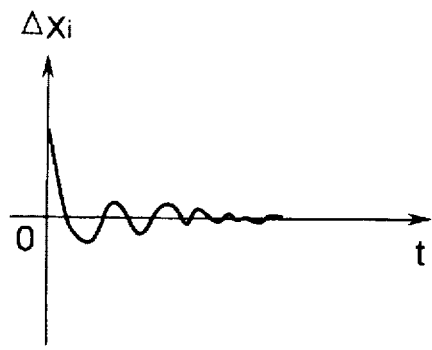
FIG. 4A is a graph showing how a positional deviation changes when located if the damping coefficient is a small fixed value.
Figure 4B:
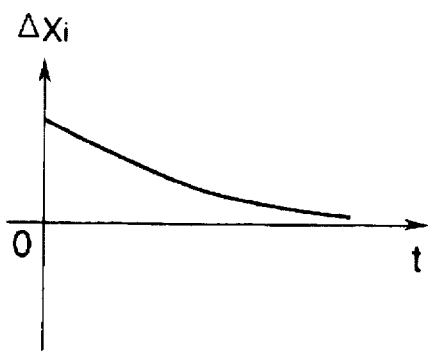
FIG. 4B is a graph showing how the positional deviation changes when located if the damping coefficient is a large fixed value.
Figure 4C:
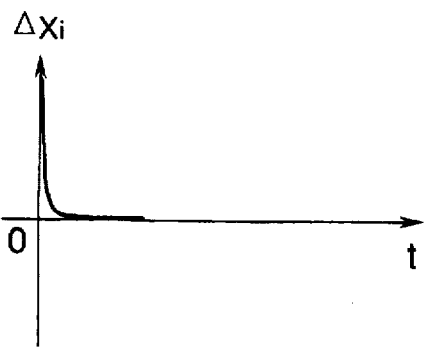
FIG. 4C is a graph showing how the positional deviation changes when located if the damping coefficient is switched stepwise in the embodiment.

In contrast with this, according to a control method wherein the damping coefficient is, for example, as in the prior art, fixed within such a range that the absolute value of the positional deviation $\Delta X_i$ is a predetermined value or under, and when the value of the damping coefficient is, e.g., small, the positional deviation $\Delta X_i$ does not smoothly converge at 0 due to the vibrations as shown in FIG. 4A. Whereas if the damping coefficient is larger, the damping force from the first linear motor turns out a comparatively large resisting force with respect to the driving force by the rotary motor. Hence, as illustrated in FIG. 4B, though no vibration is caused, the positional deviation $\Delta X_i$ does not readily decrease.

As discussed above, in accordance with this embodiment, the value of the damping coefficient $K_V$ is switched at three stages corresponding to the absolute values of the positional deviation $\Delta X_i$, and, therefore, the sample stage 1 can be located in a target position at a high speed by restraining the vibrations in the vicinity of the target position of the sample stage 1. The damping force increases only in the vicinity of the target position, and hence a load on the rotary motor 7X does not also become large.

Figure 3B:
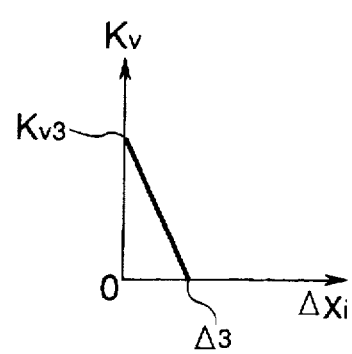
FIG. 3B is a graph showing an example where the damping coefficient is switched consecutively corresponding to the positional deviation.

It is to be noted that the value of the damping coefficient $K_V$ can be switched at four stages. Further, as illustrated in FIG. 3B, the damping coefficient $K_V$ may be consecutively reduced substantially in proportion to the absolute value of the positional deviation $\Delta X_i$. That is, in the example of FIG. 3B, the value of the damping coefficient $K_V$ changes from $K_{V3}$ to 0 during a change of the absolute value of the positional deviation $\Delta X_i$ from 0 to $\Delta_3$. Thus, the value of the damping coefficient $K_V$ is consecutively changed, thereby making it possible to locate the sample stage 1 in the target position more smoothly at the high speed. Furthermore, in the embodiment discussed above, the value of the damping coefficient $K_V$ is determined corresponding to the absolute value of the positional deviation $\Delta X_i$. Depending on the stage mechanism, however, the damping coefficient $K_V$ may be changed corresponding to the sign of the positional deviation $\Delta X_i$.

Further, in accordance with the above-described embodiment, the damping device for the driving device constructed of the rotary motor 7X and the feed screw 6X involves the use of the linear motor. For instance, however, a linear motor having a large thrust is employed as the driving device, and a linear motor having a small thrust may be used as the damping device. Moreover, the linear motor is used as the damping device in the embodiment discussed above, but, in addition to that, for example, a non-contact type magneto-electric actuator, etc. is also usable.

Further, the present invention is applicable to not only the wafer stage of the projection exposure apparatus but also a reticle stage of the projection exposure apparatus and a stage of a precision machine tool. Thus, the present invention is not limited to the embodiment discussed above but may take a variety of constructions within a range without departing from the gist of the present invention.

According to the present invention, the damping force is controlled corresponding to the deviation from the target position of the movable member and therefore gradually decreases stepwise, for example, with the larger absolute value of the deviation. The quantity of vibrations of the movable member is thereby reduced, resulting in such an advantage that the time needed for locating can be decreased. Besides, the damping force is small in the area where the deviation is large, and, therefore, there is also yielded an advantage in which the electric power can be saved without causing a large load on the driving device.

Further, for instance, the damping force is consecutively decreased as the absolute value of the deviation becomes larger, thereby making it possible to locate the movable member more smoothly.

In addition, if the damping device is the linear motor, there exists such an advantage that the damping force against the movable member can be produced by the non-contact method at the high response speed.

What is claimed is:

1. A stage device comprising:
   a base;
   a movable member movably provided on said base;
   a driving system for moving said movable member with respect to said base;
   a damping system for applying a damping force to said movable member;
   a position detector for detecting a position of said movable member with respect to said base;

a deviation detector for obtaining a deviation of a position of said movable member from a target position of said movable member on said base based on a result of the applied detection by said position detector; and a damping control system for changing the damping force in accordance with the deviation detected by said deviation detector.

2. The stage device according to claim 1, wherein said damping system includes a linear motor.

3. The stage device according to claim 1, wherein said damping control system makes the applied damping force smaller for a larger deviation.

4. The stage device according to claim 1, wherein said damping control system increases the damping force stepwise as the deviation is decreases.

5. The stage device according to claim 1, wherein said damping control system continuously increases the damping force as the deviation decreases.

6. The stage device according to claim 1, wherein said damping control system changes a damping coefficient in accordance with the deviation.

7. A stage device comprising:

a base;

a movable member movably provided on said base;

a driving system for moving said movable member with respect to said base;

a damping system for applying a damping force to said movable member; and a damping control system for changing the applied damping force in accordance with a detected deviation from a target position of said movable member on said base.

8. An exposure apparatus for transferring a mask pattern on a substrate, comprising:

a base;

a table for supporting said substrate and movably provided on said base;

a driving system for moving said table with respect to said base;

a damping system for applying a damping force to said table; and a damping control system for changing the applied damping force in accordance with a detected deviation of said table from a target position on said base.

9. A method of controlling a stage, comprising the steps of:

driving a movable member movably provided on a base toward a target position on said base;

detecting a deviation of said movable member from said target position during the driving of said movable member; and applying a damping force against said movable member during the driving of said movable member and changing the applied damping force in accordance with a magnitude of the detected deviation.

10. A method according to claim 9, wherein, as said deviation becomes greater, said damping force is reduced.

11. A method according to claim 9, wherein, as said deviation becomes smaller, said damping force is increased stepwise.

12. A method according to claim 9, wherein, as said deviation becomes smaller, said damping force is increased continuously.

* * * * *